(12) United States Patent
Yoon et al.

(10) Patent No.: US 11,800,736 B2
(45) Date of Patent: Oct. 24, 2023

(54) WINDOW SUBSTRATE AND DISPLAY DEVICE HAVING THE SAME

(71) Applicant: Samsung Display Co., Ltd., Yongin-si (KR)

(72) Inventors: Dae Ho Yoon, Yongin-si (KR); Myung Hwan Kim, Yongin-si (KR); Ji Yeon Kim, Yongin-si (KR); Ik Hyung Park, Yongin-si (KR); Seong Jin Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 243 days.

(21) Appl. No.: 15/820,113

(22) Filed: Nov. 21, 2017

(65) Prior Publication Data

US 2018/0151829 A1    May 31, 2018

(30) Foreign Application Priority Data

Nov. 30, 2016   (KR) .......................... 10-2016-0161407

(51) Int. Cl.
*H10K 50/84*   (2023.01)
*H10K 77/10*   (2023.01)
(Continued)

(52) U.S. Cl.
CPC .......... *H10K 50/841* (2023.02); *H10K 50/84* (2023.02); *H10K 77/10* (2023.02); *H10K 50/844* (2023.02); *H10K 59/12* (2023.02); *H10K 59/40* (2023.02); *H10K 2101/00* (2023.02); *H10K 2102/311* (2023.02); *H10K 2102/351* (2023.02); *Y02E 10/549* (2013.01)

(58) Field of Classification Search
None
See application file for complete search history.

(56) References Cited

U.S. PATENT DOCUMENTS

| 2001/0013756 A1* | 8/2001 | Mori | ........................ H05B 33/04 313/512 |
| 2007/0132381 A1* | 6/2007 | Hayashi | ................ H01L 51/524 313/512 |

(Continued)

FOREIGN PATENT DOCUMENTS

| JP | 2016184180 A | 10/2016 |
| KR | 10-2007-0061381 A | 6/2007 |

(Continued)

OTHER PUBLICATIONS

Corning 1737 AMLCD Glass Substrates, Material Information, available at http://www.vinkarola.com/pdf/Corning%20Glass%201737%20Properties.pdf (2003). (Year: 2003).*

(Continued)

*Primary Examiner* — Alicia Chevalier
*Assistant Examiner* — Elaine M Vazquez
(74) *Attorney, Agent, or Firm* — Lewis Roca Rothgerber Christie LLP

(57) ABSTRACT

A window substrate includes a glass substrate, and a shock wave transmission layer on a first surface of the glass substrate, wherein a density and elastic modulus of the shock wave transmission layer are respectively less than those of the glass substrate.

7 Claims, 7 Drawing Sheets

(51) Int. Cl.
  *H10K 50/844* (2023.01)
  *H10K 59/12* (2023.01)
  *H10K 59/40* (2023.01)
  *H10K 101/00* (2023.01)
  *H10K 102/00* (2023.01)

(56) References Cited

U.S. PATENT DOCUMENTS

| | | | |
|---|---|---|---|
| 2009/0038683 A1* | 2/2009 | Walter | H01L 51/0015 |
| | | | 136/263 |
| 2011/0114160 A1 | 5/2011 | Murashige et al. | |
| 2015/0200333 A1* | 7/2015 | Okumoto | H01L 51/0097 |
| | | | 257/79 |
| 2015/0266272 A1 | 9/2015 | Lee et al. | |

FOREIGN PATENT DOCUMENTS

| | | |
|---|---|---|
| KR | 10-1321341 B1 | 10/2013 |
| KR | 10-1436770 B1 | 9/2014 |
| KR | 10-1484452 B1 | 2/2015 |
| KR | 10-2015-0108991 A | 10/2015 |

OTHER PUBLICATIONS

Chemical Book, Bisphenol A Diglycidyl Ether, available at https://www.chemicalbook.com/ChemicalProductProperty_EN_CB3749115.htm (Year: 2017).*
MIT, Material Property Database, Indium Tin Oxide, available at http://www.mit.edu/~6.777/matprops/ito.htm (Year: 2019).*
Corning EAGLE 2000 AMLCD Glass Substrates Material Information (Year: 2005).*

* cited by examiner

WINDOW SUBSTRATE AND DISPLAY DEVICE HAVING THE SAME

CROSS-REFERENCE TO RELATED APPLICATIONS

This application claims priority to and the benefit of Korean Patent Application No. 10-2016-0161407 filed on Nov. 30, 2016, in the Korean Intellectual Property Office, the entire disclosure of which is incorporated by reference herein.

BACKGROUND

1. Field

An aspect of the present disclosure relates to a window substrate and a display device having the same.

2. Description of the Related Art

Recently, flexible display devices using flat panel display devices have been developed. The flat panel display devices generally include a liquid crystal display device (LCD), an organic light emitting display device (OLED), an electrophoretic display device (EPD), and the like.

Because the flexible display devices have bending and folding characteristics, the flexible display devices may be folded or rolled. Accordingly, the flexible display devices may be conveniently carried even while implementing large screens. The flexible display devices may be applied in various fields including, for example, mobile devices such as mobile phones, portable multimedia players (PMPs), navigations, ultra-mobile PCs (UMPCs), electronic books, and electronic newspapers, ad also including TVs, monitors, and the like.

SUMMARY

Embodiments provide a high-quality window substrate.

Embodiments provide a display device having the window substrate.

According to an aspect of the present disclosure, there is provided a window substrate including a glass substrate, and a shock wave transmission layer on a first surface of the glass substrate, wherein a density and elastic modulus of the shock wave transmission layer are respectively less than those of the glass substrate.

The density of the shock wave transmission layer may be equal to or greater than about 4% of the density of the glass substrate, and the elastic modulus of the shock wave transmission layer may be equal to or greater than about 2% of the elastic modulus of the glass substrate.

The density and elastic modulus in the shock wave transmission layer may decrease in a direction away from the glass substrate.

The shock wave transmission layer may include a plurality of sub-transmission layers, wherein a density and elastic modulus of a sub-transmission layer that is most distant from the glass substrate among the sub-transmission layers is respectively less than those of a sub-transmission layer adjacent to the glass substrate.

The density and elastic modulus of the sub-transmission layer distant from the glass substrate among adjacent sub-transmission layers may be equal to or greater than about 10% of the density and elastic modulus of the sub-transmission layer adjacent to the glass substrate.

The sub-transmission layers may include one of an organic material, an organic-inorganic hybrid material, and a metal.

The shock wave transmission layer may include an organic material having pores distributed therein.

A density of the pores may increase in a direction away from the glass substrate.

The window substrate may further include a coating layer on a second surface of the glass substrate, wherein a density and elastic modulus of the coating layer are respectively greater than those of the glass substrate.

The coating layer may include one of a silicon compound, a metal oxide, and an alloy.

A thickness of the coating layer may be about 1 nm to about 1 μm.

A thickness of the shock wave transmission layer is about 1 μm to about 100 μm.

According to an aspect of the present disclosure, there is provided a display device including a display panel, and a window substrate on one surface of the display panel, and including a glass substrate, and a shock wave transmission layer on a first surface of the glass substrate, wherein a density and elastic modulus of the shock wave transmission layer are respectively less than those of the glass substrate.

The density and elastic modulus in the shock wave transmission layer may decrease in a direction away from the glass substrate.

The shock wave transmission layer may include a plurality of sub-transmission layers, wherein a density and elastic modulus of a sub-transmission layer most distant from the glass substrate among the sub-transmission layers is respectively less than those of a sub-transmission layer adjacent to the glass substrate.

The density and elastic modulus of the sub-transmission layer distant from the glass substrate among adjacent sub-transmission layers may be equal to or greater than about 10% of the density and elastic modulus of the sub-transmission layer adjacent to the glass substrate.

The sub-transmission layers may include one of an organic material, an organic-inorganic hybrid material, and a metal.

The shock wave transmission layer may include an organic material having pores distributed therein, and a density of the pores may increase in a direction away from the glass substrate.

The display device may further include a coating layer on a second surface of the glass substrate, wherein a density and elastic modulus of the coating layer are respectively greater than those of the glass substrate.

DETAILED DESCRIPTION

Figure 1:
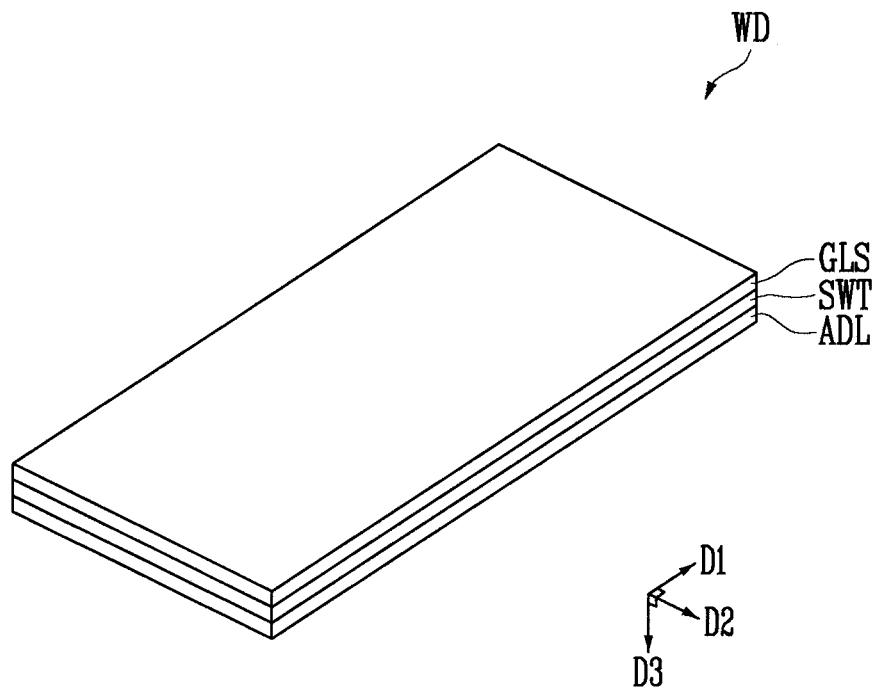
FIG. 1 is a perspective view illustrating a window substrate according to an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

An embodiment of the present disclosure describes a window substrate including a glass substrate is described. The window substrate can be employed in a display device. Particularly, the window substrate can be used as a window panel located on a front surface of a display panel. Accordingly, in embodiments of the present disclosure, the window panel is referred to as a window substrate. However, the use of the window substrate according to the described embodiments is not limited thereto, and the window substrate may be redirected to a portion requiring a transparent insulating substrate. For example, the window substrate may be used as a base substrate on which elements are mounted in the display device, or as a counter substrate that is opposite to the base substrate. In addition, the window substrate may be used as a substrate of a touch screen panel on a display substrate.

Figure 2:
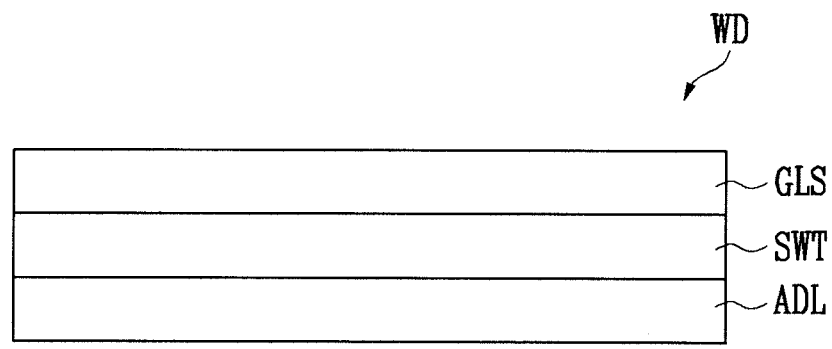
FIG. 2 is a sectional view of the window substrate shown in FIG. 1.

FIG. 1 is a perspective view illustrating a window substrate according to an embodiment of the present disclosure. FIG. 2 is a sectional view of the window substrate shown in FIG. 1.

Referring to FIGS. 1 and 2, the window substrate WD is provided in a plate shape. In the present embodiment, for convenience of description, it is assumed that the shape of the window substrate WD on a plane is a rectangular shape having a pair of long sides and a pair of short sides. In addition, it is illustrated that the extending direction of the long sides is a first direction D1, the extending direction of the short sides is a second direction D2, and the direction perpendicular to the extending directions of the long and short sides is a third direction D3. However, the shape of the window substrate WD is not limited thereto, and the window substrate WD may have various shapes. For example, the window substrate WD may be a closed-shape polygon including linear sides. In addition, the window substrate WD may be provided in various shapes including curved sides, such as a circle, an ellipse, etc. In addition, the window substrate WD may be provided in various shapes including linear and curved sides, such as a semicircle, a semi-ellipse, etc.

In an embodiment of the present disclosure, when the window substrate WD has linear sides, at least some of corners of each of the shapes may be formed in a curve. For example, when the window substrate WD has a rectangular shape, a portion at which adjacent linear sides meet each other may be replaced with a curve (e.g., a curve having a predetermined curvature). That is, a vertex portion of the rectangular shape may be formed with a curved side having both adjacent ends respectively connected to two adjacent linear sides (e.g., the curved side having a predetermined curvature). The curvature may be differently set depending on positions. For example, the curvature may be changed depending on a position at which the curve is started, a length of the curve, etc.

The window substrate WD may include a glass substrate GLS, a shock wave transmission layer SWT, and an adhesive layer ADL.

The glass substrate GLS may have a shape corresponding to that of the window substrate WD. Also, the glass substrate GLS may be provided in a plate shape having two major surfaces. The glass substrate GLS may include a glass material including silicate. For example, the glass substrate GLS may include a material including aluminosilicate, borosilicate, boroaluminosilicate, etc. In an embodiment of the present disclosure, the glass substrate GLS may further include various materials to improve durability, surface smoothness, and transparency of the glass substrate GLS. For example, the glass substrate GLS may further include alkali metal or alkali earth metal and oxides thereof.

In an embodiment of the present disclosure, the glass substrate GLS may include $Al_2O_3$, $Na_2O$, and $SiO_2$. In an embodiment of the present disclosure, the glass substrate GLS may further include $B_2O_3$, MgO, CaO, BaO, $SnO_2$, $ZrO_2$, $Na_2O$, SrO, and the like. The $Al_2O_3$, $Na_2O$, and $SiO_2$ among the materials included in the glass substrate GLS may be contained at various composition ratios. For example, the glass substrate GLS may include about 1 mol % to about 10 mol % of $Al_2O_3$, exceeding about 10 mol % to not more than about 15 mol % of $Na_2O$, and about 65 mol % to about 70 mol % of $SiO_2$.

In an embodiment of the present disclosure, the glass substrate GLS may include a suitable ratio of $Al_2O_3/NaO_2$ so as to improve the shock resistance thereof. For example, the ratio of $Al_2O_3/NaO_2$ contained in the glass substrate GLS, may be equal to or smaller than about 1. When the ratio of $Al_2O_3/NaO_2$ exceeds about 1, the shock resistance of the glass substrate GLS may be weakened, and the glass substrate GLS may be more easily broken by a weak shock. In an embodiment of the present disclosure, the ratio of $Al_2O_3/NaO_2$ may be about 0.2 to about 0.5. In an embodiment of the present disclosure, the ratio of $Al_2O_3/NaO_2$ may be about 0.3 to about 0.4.

In an embodiment of the present disclosure, the materials included in the glass substrate GLS are not limited to the above-described materials, and the glass substrate GLS may include various other materials at various composition ratios. The glass substrate GLS may have a relatively low elastic modulus as compared with other existing glass substrates.

In an embodiment of the present disclosure, the glass substrate GLS may have flexibility. Accordingly, the glass substrate GLS may be curved, folded, or rolled. Hereinafter, for convenience of illustration, a case where the glass substrate GLS is curved, folded, or rolled will be described as the glass substrate GLS being folded or bent.

In an embodiment of the present disclosure, the glass substrate GLS may have a thickness of about 100 μm or less. When the thickness of the glass substrate GLS exceeds about 100 μm, the repulsive force against deformation may be excessively increased, and therefore, it may be more difficult to bend the window substrate WD. In an embodiment of the present disclosure, the thickness of the glass substrate GLS may be about 25 μm to about 100 μm. When the thickness of the glass substrate GLS is less than about 25 μm, the rigidity of the glass substrate GLS is relatively low, and therefore, the glass substrate GLS may be damaged in a process. However, the glass substrate GLS may be suitable as its thickness decreases, and therefore, the thickness of the glass substrate GLS may be formed to be less than about 25 um within a limit that satisfies rigidity and processability. In an embodiment of the present disclosure, the glass substrate GLS may have a thickness of about 50 um to about 80 μm. Here, damage of the window substrate WD means a state in which the window substrate WD disclosed in the present disclosure can no longer be used for an intended purpose, such as a state in which the window substrate WD is broken, a state in which a flaw or crack is generated in the window substrate WD, a state in which the flaw or crack is propagated, or a state in which the window substrate WD is ruptured.

As for the glass substrate GLS having a small thickness as described above, if an object having a narrow sectional area, such as a pen, collides with a top surface of the glass substrate GLS, a shock wave may be generated in the glass substrate GLS. A region in which the pen is in contact with the glass substrate GLS is locally deformed by the shock wave, and a large stress may be applied to a back surface that is an outer surface, as compared with the top surface that includes a deformed inner surface. There may occur a bending breakage where the glass substrate GLS is broken by the stress. To reduce a degree of the bending breakage, a shock resistance characteristic of the glass substrate GLS may be improved.

The glass substrate GLS according to the present embodiment may be a reinforced glass that is chemically reinforced by an ion exchange process to improve the shock resistance of the glass substrate GLS. In the present disclosure, the term "ion exchange process" means that the glass exchanges a positive ion of a same atomic value with a positive ion on or near the surface of the glass at a temperature that is equal to, or smaller than, a deformation point of the glass substrate GLS. For example, the ion exchange process may mean that a positive ion (e.g., a positive ion of an alkali metal, such as $Na^+$ or $Li^+$) inside the glass is exchanged with another positive ion that is outside the glass. The ion exchange process may be used to provide the profile of compressive stress extending to a suitable depth from one or both surfaces of the glass. When the compressive stress is provided to the glass substrate GLS, a high strength is provided in bending of the glass substrate as long as the flaw corresponds to a region defined by a reference line where the compressive stress is 0 in a compressive stress graph.

In an embodiment of the present disclosure, the shock wave transmission layer SWT may be on one surface of the glass substrate GLS. The shock wave transmission layer SWT may be optically transparent, meaning that the light transmittance of the shock wave transmission layer SWT may be equal to or greater than about 80%.

The shock wave transmission layer SWT may receive the shock wave applied to the glass substrate GLS, and may transmit or dissipate the received shock wave to the outside.

The density and elastic modulus of the shock wave transmission layer SWT may be respectively less than those of the glass substrate GLS, such that the shock wave may be transmitted from the glass substrate GLS to the shock wave transmission layer SWT.

In addition, the density of the shock wave transmission layer SWT may be equal to or greater than about 4% of the density of the glass substrate GLS. In addition, the elastic modulus of the shock wave transmission layer SWT may be equal to or greater than about 2% of the elastic modulus of the glass substrate GLS.

If the density of the shock wave transmission layer SWT is equal to or greater than about 4% of the density of the glass substrate GLS, and if the elastic modulus of the shock wave transmission layer SWT is equal to or greater than about 2% of the elastic modulus of the glass substrate GLS, the shock wave applied to the glass substrate GLS is not reflected from the interface between the glass substrate GLS and the shock wave transmission layer SWT, but may instead be transmitted to the shock wave transmission layer SWT. If the shock wave is transmitted from the glass substrate GLS to the shock wave transmission layer SWT, the shock wave may be transmitted or dissipated to the outside of the shock wave transmission layer SWT (e.g., to the adhesive layer ADL).

However, if the density of the shock wave transmission layer SWT is less than about 4% of the density of the glass substrate GLS, and if the elastic modulus of the shock wave transmission layer SWT is less than about 2% of the elastic modulus of the glass substrate GLS, the shock wave might not transmitted to the shock wave transmission layer SWT, but may instead be reflected from the interface between the glass substrate GLS and the shock wave transmission layer SWT. When the shock wave is reflected from the interface between the glass substrate GLS and the shock wave transmission layer SWT, constructive interference of different components of the shock wave may occur in the glass substrate GLS such that the glass substrate GLS may be broken.

The shock wave transmission layer SWT may have a thickness of about 1 µm to about 100 µm. If the thickness of the shock wave transmission layer SWT is less than about 1 µm, it may be difficult for the shock wave transmission layer SWT to sufficiently transmit or dissipate the shock wave that is received from the glass substrate GLS to the outside. In addition, if the thickness of the shock wave transmission layer SWT exceeds about 100 µm, the repulsive force against deformation is increased as the total thickness of the window substrate WD is increased, making it potentially difficult to bend the window substrate WD.

In an embodiment of the present disclosure, the shock wave transmission layer SWT may include at least one of an organic material, an organic-inorganic hybrid material, a metal, and an alloy.

The organic material may include at least one of polyvinyl resin, polysiloxane resin, polymethacrylate resin, polyacrylate resin, polyester resin, polyether-ester resin, polyurethane resin, fluorinated polymer, fluorinated copolymer, polystyrene resin, polycarbonate resin, polysilazane resin, and polyvinylcarbazole resin.

The adhesive layer ADL may be on the shock wave transmission layer SWT. The adhesive layer ADL may allow the window substrate WD to be attached to a display panel.

In an embodiment of the present disclosure, the adhesive layer ADL may include an optically clear glue or adhesive. In an embodiment of the present disclosure, the density and elastic modulus of the adhesive layer ADL may be respectively less than those of the shock wave transmission layer SWT. Thus, the shock wave is transmitted to the adhesive layer ADL through the shock wave transmission layer SWT, and is emitted to the outside. In addition, because the density and elastic modulus of the adhesive layer ADL is generally very low, the shock wave transmitted to the adhesive layer ADL may be relieved inside, or absorbed by, the adhesive layer ADL.

In an embodiment of the present disclosure, the adhesive layer may include at least one of acrylic polymer, ethylene vinyl acetate polymer, nitrile polymer, silicone rubber, butyl rubber, styrene block copolymer, vinyl ether polymer, urethane polymer, and epoxy polymer. For example, the adhesive layer ADL may include urethane polymer. Also, the adhesive layer ADL may include urethane polymer and rubber, or may include urethane polymer and acrylic polymer.

In an embodiment of the present disclosure, the window substrate WD may be provided with the shock wave transmission layer SWT to have shock resistance. In particular, in the window substrate WD, bending deformation caused by a point shock (e.g., an impact point) may be reduced.

In an embodiment of the present disclosure, the window substrate WD may have flexibility, and accordingly can be curved, folded, or rolled. That is, the window substrate WD may be folded in a direction in which a portion of the outer surface of the glass substrate GLS faces the rest of the outer surface of the glass substrate GLS (e.g., such that the glass substrate GLS is folded in on itself). Also, the window substrate WD may instead be folded in a direction in which a portion of the inner surface of the glass substrate GLS faces the rest of the inner surface of the glass substrate GLS. Hereinafter, the term "folded" or "bended" does not necessarily mean a fixed shape, but means a shape deformable into another shape from the original shape, and includes a shape that is folded, bent, curved, or rolled like a roll along one or more specific lines.

Figure 3:
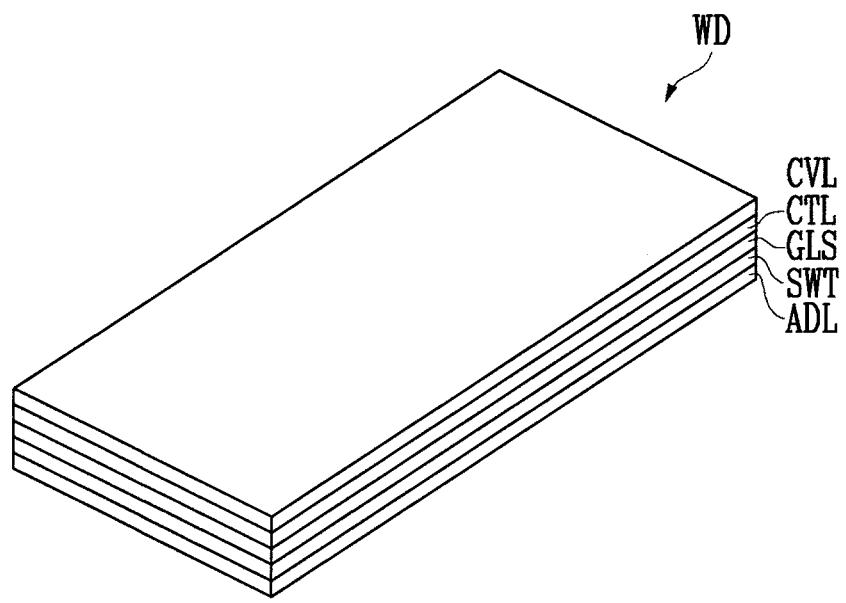
FIG. 3 is a perspective view illustrating a window substrate according to an embodiment of the present disclosure.
Figure 4:
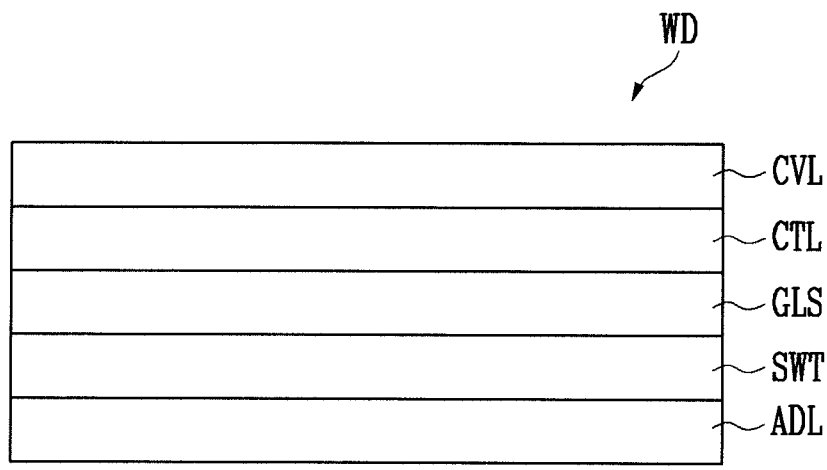
FIG. 4 is a sectional view of the window substrate shown in FIG. 3.

FIG. 3 is a perspective view illustrating a window substrate according to an embodiment of the present disclosure. FIG. 4 is a sectional view of the window substrate shown in FIG. 3.

Referring to FIGS. 3 and 4, the window substrate WD may include a glass substrate GLS, a shock wave transmission layer SWT on one surface of the glass substrate GLS, and an adhesive layer ADL on the shock wave transmission layer SWT. The window substrate WD may further include a coating layer CTL on the other surface of the glass substrate GLS, and a cover layer CVL on the coating layer CTL.

The glass substrate GLS may have a shape corresponding to that of the window substrate WD. Also, the glass substrate GLS may have a plate shape having two major surfaces.

The shock wave transmission layer SWT is on the one surface of the glass substrate GLS, and may be optically transparent. The shock wave transmission layer SWT may receive a shock wave applied to the glass substrate GLS to emit or dissipate the shock wave to the outside, or to transmit the shock wave to the adhesive layer ADL. The density and elastic modulus of the shock wave transmission layer SWT may be respectively less than those of the glass substrate GLS.

The adhesive layer ADL may allow the window substrate WD to be attached to a display panel therethrough. The adhesive layer ADL may include an optically transparent glue or adhesive. The density and elastic modulus of the adhesive layer ADL may be respectively less than those of the shock wave transmission layer SWT.

The coating layer CTL is on the other surface of the glass substrate GLS, and may reinforce the surface of the substrate GLS. The coating layer CTL may be optically transparent. In an embodiment of the present disclosure, the density and elastic modulus of the coating layer CTL may be respectively greater than those of the glass substrate GLS, such that a shock wave generated by a shock applied to a surface of the window substrate WD may be transmitted to the glass substrate GLS through the coating layer CLT. Also, the shock wave may be transmitted from the glass substrate GLS through the shock wave transmission layer SWT and the adhesive layer ADL. The shock wave transmitted to the adhesive layer ADL may be dissipated or emitted to the outside, or may be relieved inside, or absorbed by, the adhesive layer ADL.

In an embodiment of the present disclosure, the coating layer CTL may include one of a silicon compound, a metal oxide, a metal, and an alloy. The silicon compound may include one of silicon oxide, silicon nitride, and silicon oxynitride. When the coating layer CTL includes the metal and the alloy, the coating layer CTL may have a thickness that is sufficiently small to enable light to be transmitted therethrough.

In an embodiment of the present disclosure, the coating layer CTL may have a thickness of about 5 nm to about 1 µm. If the thickness of the coating layer CTL is smaller than about 5 nm, the ability of the coating layer CTL to reinforce the surface of the glass substrate GLS may be deteriorated. In addition, if the thickness of the coating layer CTL exceeds about 1 µm, the thickness of the window substrate WD may be unsuitably increased by the coating layer CTL such that the repulsive force against deformation is increased, and therefore, it may be difficult to bend the window substrate WD.

In an embodiment of the present disclosure, the cover layer CVL may be on a surface in a direction facing a user of the two major surfaces of the window substrate WD. For example, the cover layer CVL may be on the coating layer CTL. The cover layer CVL is a surface that is directly exposed to the user, and may be on a surface on which a touch of a finger of the user, a touch using a stylus pen, or a contact of an external object may occur.

In an embodiment of the present disclosure, the cover layer CVL may be an anti-reflection layer that reduces or minimizes reflection on the surface of the glass substrate GLS. In an embodiment of the present disclosure, the cover layer CVL may be an anti-stain layer that reduces or prevents a stain, such as a stain caused by a handprint (e.g., a fingerprint) of the user. Meanwhile, although a case where the cover layer CVL is an anti-reflection layer or an anti-stain layer is described as an example, the present disclosure is not limited thereto. For example, the cover layer CVL may have various functions according to characteristics that may be suitable for the window substrate WD.

In the present embodiment, the cover layer CVL is illustrated as a single layer, but the present disclosure is not limited thereto. The cover layer CVL may be provided as a plurality of layers having various functions.

In the present embodiment, in the window substrate WD, the cover layer CVL is located on a surface facing the user, but the present disclosure is not limited thereto. For example, the cover layer CVL may be located on a surface that does not face the user. In this case, the cover layer CVL can improve the shock resistance of the window substrate WD, and can reduce or prevent scattering of the window substrate WD when the window substrate is damaged.

Figure 5:
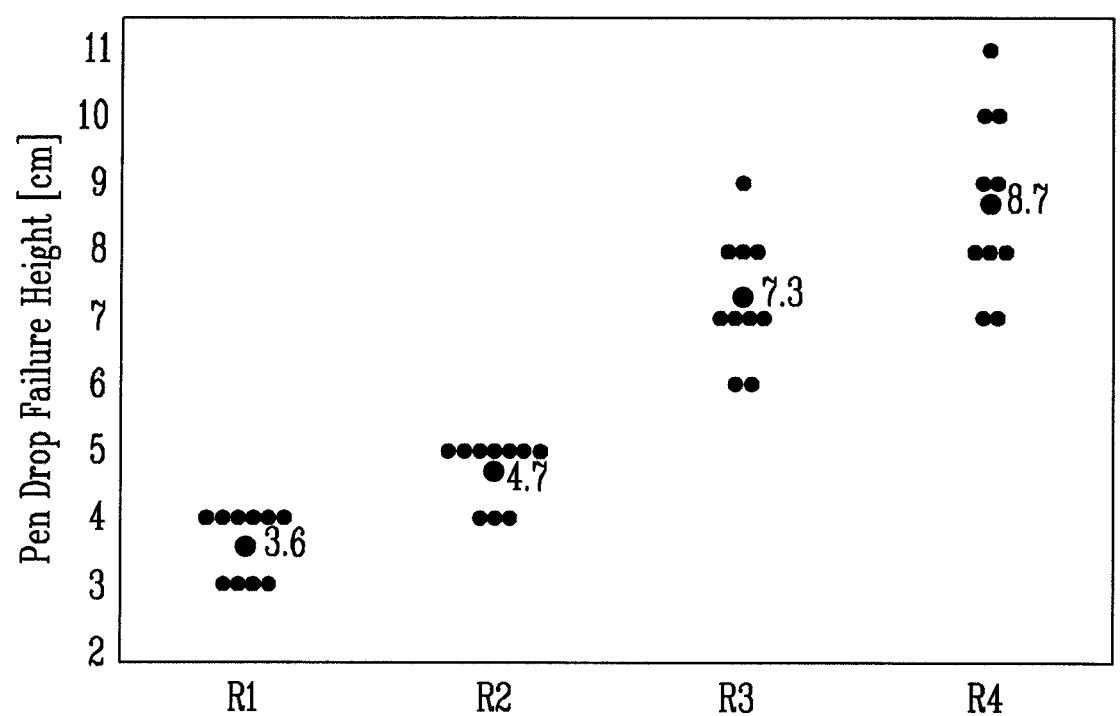
FIG. 5 is a graph illustrating results obtained by performing a pen drop test on window substrates having no shock wave transmission layer and window substrates having shock wave transmission layers.

FIG. 5 is a graph illustrating results obtained by performing a pen drop test on window substrates having no shock wave transmission layer and on window substrates having shock wave transmission layers. In FIG. 5, an experimental example of R1 illustrates a result obtained by performing the pen drop test on a window substrate including a glass substrate that has a thickness of 70 µm, and that includes a reinforced glass and an adhesive layer on one surface of the glass substrate and has a thickness of 50 µm. In FIG. 5, an experimental example of R2 illustrates a result obtained by performing the pen drop test on a window substrate including a glass substrate that has a thickness of 70 µm, and that includes a reinforced glass, an adhesive layer that is on one surface of the glass substrate and has a thickness of 50 µm, and a coating layer that is on the other surface of the glass substrate and includes silicon nitride ($Si_3N_4$). In FIG. 5, an experimental example of R3 illustrates a result obtained by performing the pen drop test on a window substrate including a glass substrate that has a thickness of 70 µm and includes a reinforced glass, an adhesive layer that is on one surface of the glass substrate and has a thickness of 50 µm, and a shock wave transmission layer that is between the glass substrate and the adhesive layer, includes polyurethane acrylate, and has a thickness of 10 µm. In FIG. 5, an experimental example of R4 illustrates a result obtained by performing the pen drop test on a window substrate including a glass substrate that has a thickness of 70 µm and includes a reinforced glass, an adhesive layer that is on one surface of the glass substrate and has a thickness of 50 µm, a shock wave transmission layer that is between the glass substrate and the adhesive layer, includes polyurethane acrylate, and has a thickness of 10 µm, and a coating layer that is on the other surface of the glass substrate and includes silicon nitride ($Si_3N_4$).

Referring to FIG. 5, the pen drop test may test bending deformation caused by a point shock of a window substrate. For example, the pen drop test may test whether the window substrate is damaged by allowing a specific pen (Fine BIC® pen produced by Société BIC, BIC being a registered trademark owned by SOCIETE BIC société anonyme (sa) FRANCE 14, rue Jeanne d'Asnieres Clichy FRANCE 92110) which is covered with a lid to freely drop in a state in which the pen is perpendicular to a surface of the window substrate.

According to the results obtained by performing the pen drop test, shown in FIG. 5, it can be seen that the window substrates have different shock resistances depending on layers or films located on the glass substrates.

The window substrate R1 including only the glass substrate and the adhesive layer may be damaged when the pen freely drops at a height of about 3.6 cm.

The window substrate R2 including the glass substrate, the adhesive layer on the one surface of the glass substrate, and the coating layer on the other surface of the glass substrate may be damaged when the pen freely drops at a height of about 4.7 cm.

The window substrate R3 including the glass substrate, the adhesive layer on one surface of the glass substrate, and the shock wave transmission layer between the glass substrate and the adhesive layer may be damaged when the pen freely drops at a height of about 7.3 cm. That is, the window substrate R3 may have a shock resistance of at least about 7.3 cm. In other words, when the pen freely drops toward the window substrate R3 at a height of about 7 cm or lower, the window substrate R3 may not be broken or damaged.

The window substrate R4 including the glass substrate, the adhesive layer on one surface of the glass substrate, the shock wave transmission layer between the glass substrate and the adhesive layer, and the coating layer on the other surface of the glass substrate may be damaged when the pen freely drops at a height of about 8.7 cm. That is, when the pen freely drops toward the window substrate R4 at a height of about 8.7 cm or lower, the window substrate R4 may not be broken or damaged.

According to the results obtained by performing the pen drop test, it can be seen that, when the window substrate includes the shock wave transmission layer on one surface of the glass substrate, the shock resistance of the window substrate against a point impact is improved.

Figure 6:
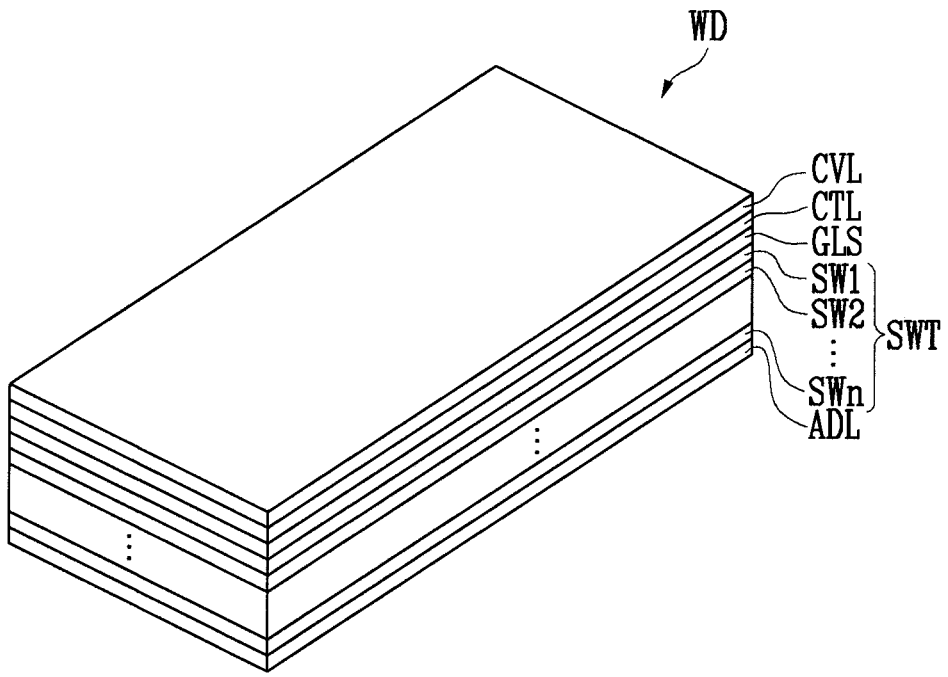
FIG. 6 is a perspective view illustrating a window substrate according to an embodiment of the present disclosure.
Figure 7:
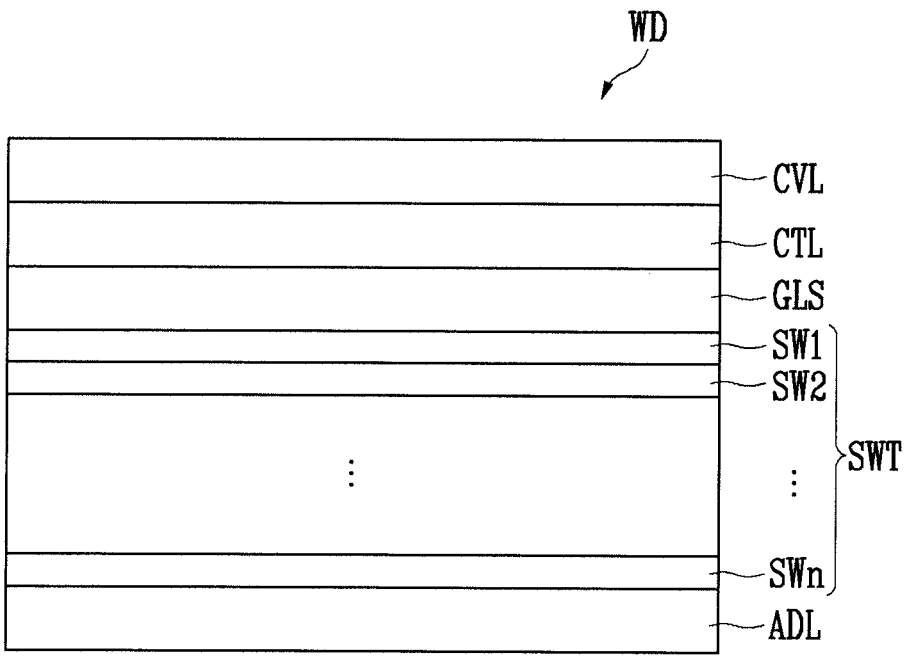
FIG. 7 is a sectional view of the window substrate shown in FIG. 6.

FIG. 6 is a perspective view illustrating a window substrate according to an embodiment of the present disclosure. FIG. 7 is a sectional view of the window substrate shown in FIG. 6.

Referring to FIGS. 6 and 7, the window substrate WD may further include a glass substrate GLS, a shock wave transmission layer SWT on one surface of the glass substrate GLS, an adhesive layer ADL on the shock wave transmission layer SWT, a coating layer CTL on the other surface of the glass substrate GLS, and a cover layer CVL on the coating layer CTL.

The glass substrate GLS may have a shape corresponding to that of the window substrate WD. Also, the glass substrate GLS may have a plate shape having two major surfaces.

The shock wave transmission layer SWT is on one surface of the glass substrate GLS, and may be optically transparent. The shock wave transmission layer SWT may receive a shock wave applied to the glass substrate GLS to emit or dissipate the shock wave to the outside, or may transmit the shock wave to the adhesive layer ADL. The density and elastic modulus of the shock wave transmission layer SWT may be respectively less than those of the glass substrate GLS.

In an embodiment of the present disclosure, the shock wave transmission layer SWT may include a plurality of sub-transmission layers SW1, SW2, . . . , SWn. The density and elastic modulus of the sub-transmission layers SW1, SW2, . . . , SWn may be respectively less than those of the glass substrate GLS.

In an embodiment of the present disclosure, the density and elastic modulus of the sub-transmission layers SW1, SW2, . . . , SWn may be decreased as the sub-transmission layers SW1, SW2, . . . , SWn become more distant from the glass substrate GLS. For example, the density and elastic modulus of a sub-transmission layer most distant from the glass substrate GLS among adjacent sub-transmission layers SW1, SW2, . . . , SWn may be respectively less than those of a sub-transmission layer adjacent to the glass substrate GLS. In addition, the density and elastic modulus of a first sub-transmission layer SW1 most adjacent to the glass substrate GLS among the sub-transmission layers SW1, SW2, . . . , SWn may be respectively greater than those of the other sub-transmission layers SW2, . . . , SWn. In addition, the density and elastic modulus of an nth sub-transmission layer SWn that is most distant from the glass substrate GLS among the sub-transmission layers SW1, SW2, . . . , SWn may be respectively less than those of the other sub-transmission layers SW1, SW2, . . . , SWn-1. That is, the density and elastic modulus in the shock wave transmission layer SWT may decrease as the shock wave transmission layer SWT becomes more distant from the glass substrate GLS.

In an embodiment of the present disclosure, the density and elastic modulus of the sub-transmission layer that is most distant from the glass substrate GLS among the adjacent sub-transmission layers SW1, SW2, . . . , SWn may be equal to or greater than about 10% of the density and elastic modulus of the sub-transmission layer adjacent to the glass substrate GLS (e.g., first sub-transmission layer SW1). For example, the density and elastic modulus of the first sub-transmission layer SW1 is equal to or greater than about 10% of the density and elastic modulus of the glass substrate GLS, and the density and elastic modulus of the second sub-transmission layer SW2 may be equal to or greater than about 10% of the density and elastic modulus of the first sub-transmission layer SW1. In addition, the density and elastic modulus of the nth sub-transmission layer SWn may be equal to or greater than about 10% of the density and elastic modulus of an (n-1)th sub-transmission layer SWn-1.

A shock wave generated in the glass substrate GLS may be transmitted to the shock wave transmission layer SWT. In addition, the shock wave transmitted to the shock wave transmission layer SWT may be transmitted in a direction away from the glass substrate GLS through the sub-transmission layers SW1, SW2, . . . , SWn. Then, the shock wave may be dissipated or emitted to the outside through the adhesive layer ADL or be relieved.

In an embodiment of the present disclosure, the sub-transmission layers SW1, SW2, . . . , SWn may include at least one of an organic material, an organic-inorganic hybrid material, a metal, and an alloy.

The organic material may include at least one of polyvinyl resin, polysiloxane resin, polymethacrylate resin, polyacrylate resin, polyester resin, polyether-ester resin, polyurethane resin, fluorinated polymer, fluorinated copolymer, polystyrene resin, polycarbonate resin, polysilazane resin, and polyvinylcarbazole resin.

The adhesive layer ADL may allow the window substrate WD to be attached to a display panel. The adhesive layer ADL may include an optically transparent glue or adhesive. The density and elastic modulus of the adhesive layer ADL may be respectively less than those of the shock wave transmission layer SWT.

The coating layer CTL is on the other surface of the glass substrate GLS, and may reinforce the surface of the substrate GLS. The density and elastic modulus of the coating layer CTL may be respectively greater than those of the glass substrate GLS.

The cover layer may be an anti-reflection layer that reduces or minimizes reflection on the surface of the glass substrate GLS. Also, the cover layer CVL may be an anti-stain layer that reduces or prevents a stain such as a handprint (e.g., a fingerprint) of the user.

Figure 8:
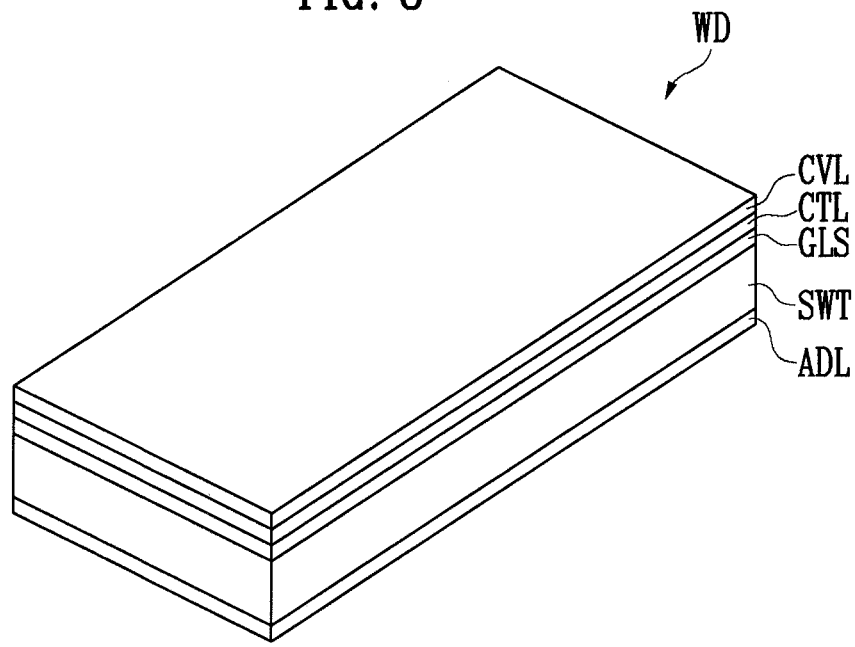
FIG. 8 is a perspective view illustrating a window substrate according to an embodiment of the present disclosure.
Figure 9:
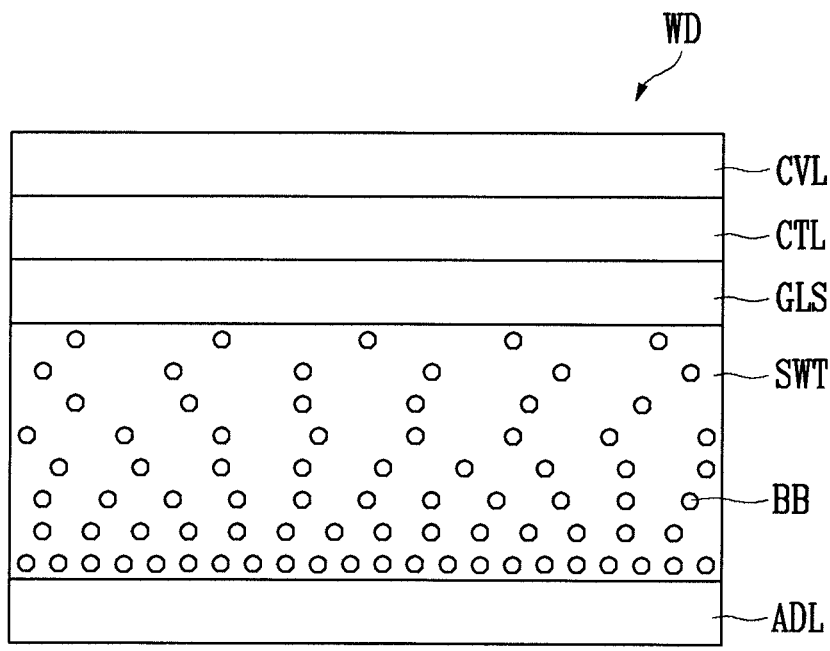
FIG. 9 is a sectional view of the window substrate shown in FIG. 8.

FIG. 8 is a perspective view illustrating a window substrate according to an embodiment of the present disclosure. FIG. 9 is a sectional view of the window substrate shown in FIG. 8.

Referring to FIGS. 8 and 9, the window substrate WD may include a glass substrate GLS, a shock wave transmission layer SWT on one surface of the glass substrate GLS, and an adhesive layer ADL on the shock wave transmission layer SWT. The window substrate WD may further include a coating layer CTL on the other surface of the glass substrate GLS and a cover layer CVL on the coating layer CTL.

The glass substrate GLS may have a shape corresponding to that of the window substrate WD. Also, the glass substrate GLS may have a plate shape having two major surfaces.

The shock wave transmission layer SWT is on the one surface of the glass substrate GLS, and may be optically transparent. The shock wave transmission layer SWT may receive a shock wave applied to the glass substrate GLS to emit the shock wave to the outside, or to transmit the shock wave to the adhesive layer ADL. The density and elastic modulus of the shock wave transmission layer SWT may be respectively less than those of the glass substrate GLS.

In an embodiment of the present disclosure, the shock wave transmission layer SWT may include an organic material, while a plurality of pores BB may be distributed in the organic material. In the shock wave transmission layer SWT, the density of the pores BB may be increased as the pores BB become more distant from the glass substrate GLS. Therefore, the density and elastic modulus in the shock wave transmission layer SWT may decrease in a direction away from the glass substrate GLS.

If the density and elastic modulus in the shock wave transmission layer SWT is decreased as the shock wave transmission layer SWT becomes more distant from the glass substrate GLS, the shock wave applied to the glass substrate GLS may be transmitted to the adhesive layer ADL through the shock wave transmission layer SWT.

The organic material may include at least one of polyvinyl resin, polysiloxane resin, polymethacrylate resin, polyacrylate resin, polyester resin, polyether-ester resin, polyurethane resin, fluorinated polymer, fluorinated copolymer, polystyrene resin, polycarbonate resin, polysilazane resin, and polyvinylcarbazole resin.

A shock wave generated in the glass substrate GLS may be transmitted to the shock wave transmission layer SWT. In addition, the shock wave transmitted to the shock wave transmission layer SWT may be transmitted in a direction away from the glass substrate GLS through the sub-transmission layers SW1, SW2, ..., SWn. Then, the shock wave may be dissipated or emitted to the outside through the adhesive layer ADL, or may be relieved.

The adhesive layer ADL may allow the window substrate WD to be attached to a display panel. The adhesive layer ADL may include an optically transparent glue or adhesive. The density and elastic modulus of the adhesive layer ADL may be respectively less than those of the shock wave transmission layer SWT.

The coating layer CTL is on the other surface of the glass substrate GLS, and may reinforce the surface of the substrate GLS. The density and elastic modulus of the coating layer CTL may be respectively greater than those of the glass substrate GLS.

The cover layer may be an anti-reflection layer that reduces or minimizes reflection on the surface of the glass substrate GLS. Also, the cover layer CVL may be an anti-stain layer that reduces or prevents a stain such as a handprint (e.g., a fingerprint) of the user.

Figure 10:
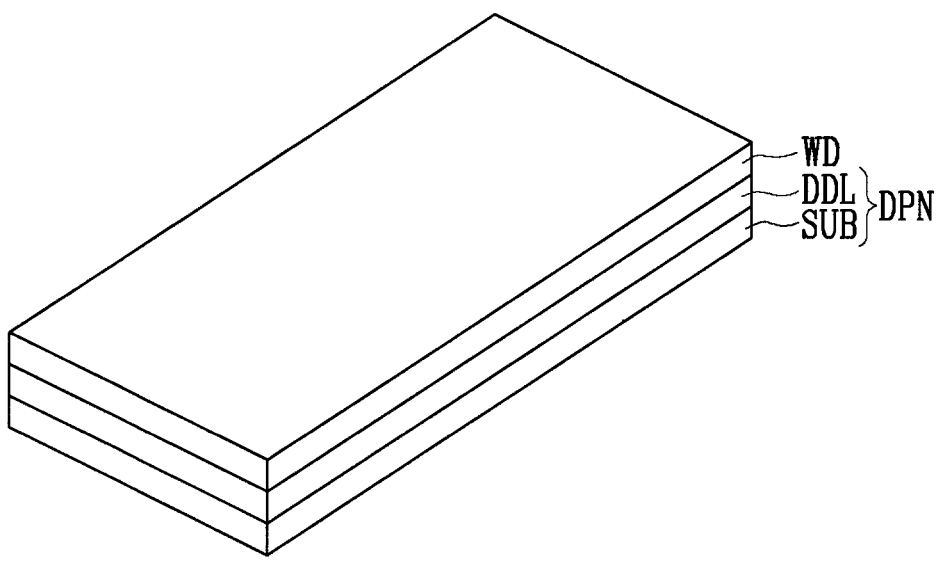
FIG. 10 is a perspective view illustrating a display device having the window substrate shown in FIGS. 1 to 4 and 6 to 9.
Figure 11:
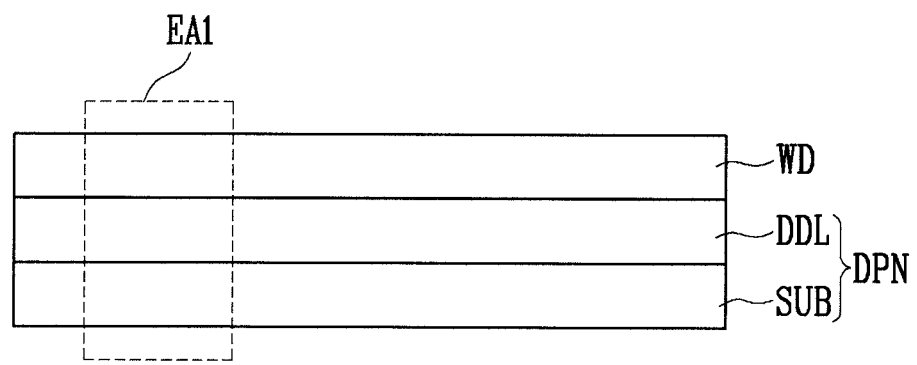
FIG. 11 is a sectional view illustrating the display device of FIG. 10.
Figure 12:
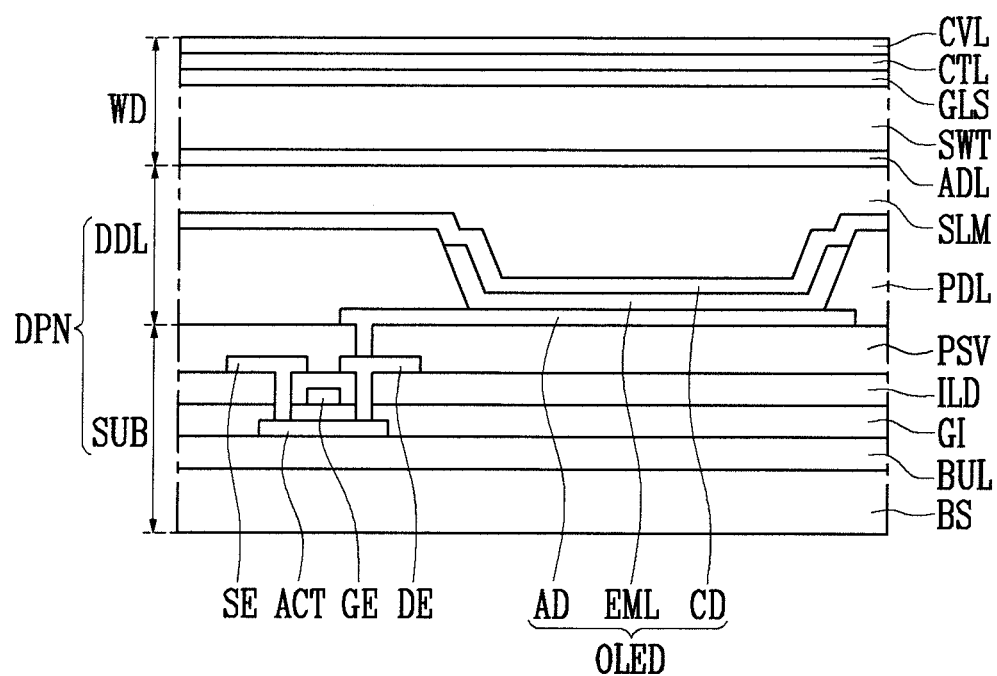
FIG. 12 is an enlarged view of area EA1 of FIG. 11.

FIG. 10 is a perspective view illustrating a display device having the window substrate shown in FIGS. 1 to 4 and 6 to 9. FIG. 11 is a sectional view illustrating the display device of FIG. 10. FIG. 12 is an enlarged view of area EA1 of FIG. 11.

Referring to FIGS. 10 to 12, the display device may include a display panel DPN and a window substrate WD.

The display panel DPN may be any one of a liquid crystal display panel (LCD panel), an electrophoretic display panel (EPD panel), an electrowetting display panel (EWD panel), and an organic light emitting display panel (OLED panel). Hereinafter, for convenience of illustration, the OLED panel is described as an example of the display panel DPN.

The display panel DPN may have various shapes. For example, the display panel DPN may be provided in the shape of a closed-shape polygon including linear sides. In addition, the display panel DPN may be provided in various shapes such as a circle, an ellipse, etc., including curved sides. In addition, the display panel DPN may be provided in various shapes such as a semicircle, a semi-ellipse, etc., including linear and curved sides.

The display panel DPN may include a display area, and may include a non-display area at the periphery of the display area.

A plurality of pixels may be provided in the display area. In addition, a plurality of gate lines, and a plurality of data lines intersecting the gate lines, may be provided in the display area. Each of the pixels may include at least one thin film transistor connected to one of the gate lines and one of the data lines, and a display element OLED connected to the thin film transistor.

In the pixel, the display panel DPN may include an array substrate SUB, and a display layer DDL on the array substrate SUB.

The array substrate SUB may include a base substrate BS, at least one thin film transistor on the base substrate BS, a buffer layer BUL between the base substrate BS and the thin film transistor, and a protective layer PSV that covers the thin film transistor.

The base substrate BS may include a transparent insulating material to enable light to be transmitted therethrough. The base substrate BS may be a rigid substrate. For example, the base substrate BS may be one of a glass substrate, a quartz substrate, a glass ceramic substrate, and a crystalline glass substrate. In addition, the base substrate BS may alternatively be a flexible substrate. Here, the base substrate BS may be one of a film substrate including a polymer organic material, and a plastic substrate including a polymer organic material. For example, the base substrate BS may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the base substrate BS may be variously changed, and may include a fiber reinforced plastic (FRP), etc.

The thin film transistor may include an active layer ACT, a gate electrode GE insulated from the active layer ACT, and source and drain electrodes SE and DE each connected to the active layer ACT.

The active layer ACT may be located on the base substrate BS. The active layer ACT may include any one of amorphous silicon (a-Si), polycrystalline silicon (p-Si), oxide semiconductor, and organic semiconductor. Here, the oxide semiconductor may include at least one of Zn, In, Ga, Sn, and any mixture thereof. For example, the oxide semiconductor may include indium-gallium-zinc oxide (IGZO).

In the active layer ACT, regions connected to the source and drain electrodes SE and DE may be source and drain regions doped or injected with impurities. In addition, a region between the source and drain regions may be a channel region.

Meanwhile, when the active layer ACT includes the oxide semiconductor, a light blocking layer for blocking light introduced into the active layer ACT may be located above and below the active layer ACT.

A gate insulating layer GI that covers the active layer ACT may be located over the active layer ACT. The gate insulating layer GI may allow the active layer ACT and the gate electrode GE to be insulated from each other. The gate insulating layer GI may include at least one of an organic insulating layer and an inorganic insulating layer. The organic insulating layer may include an organic insulating material that enables light to be transmitted therethrough. For example, the organic insulating layer may include at least one of polyacrylate resin, epoxy resin, phenolic resin, polyamide resin, polyimide resin, unsaturated polyester resin, polyphenylene ether resin, polyphenylene sulfide resin, and benzocyclobutene resin. The inorganic insulating layer may include at least one of silicon oxide (SiOx), silicon nitride (SiNx), and silicon oxynitride (SiON).

The gate electrode GE may be located on the gate insulating layer GI. At least a portion of the gate electrode GE may overlap with the active layer ACT. In addition, the gate electrode GE may include a conductive material.

An interlayer insulating layer ILD may be located over the gate electrode GE. That is, the interlayer insulating layer ILD may cover the gate electrode GE. Like the gate insulating layer GI, the interlayer insulating layer ILD may include at least one of an organic insulating layer and an inorganic insulating layer. In addition, a portion of the interlayer insulating layer ILD may be removed, to allow the source and drain regions of the active layer ACT to be exposed therethrough.

The source electrode SE and the drain electrode DE may be located on the interlayer insulating layer ILD. The source electrode SE and the drain electrode DE may be insulated from the gate electrode GE by the interlayer insulating layer ILD. Also, the source electrode SE and the drain electrode DE may be connected to the source region and the drain region, respectively.

Meanwhile, in this embodiment, a case where the thin film transistor TFT is a thin film transistor having a top gate structure in which the gate electrode GE is located on the active layer ACT is described as an example, but the present disclosure is not limited thereto. For example, the thin film transistor TFT may be a thin film transistor having a bottom gate structure in which the gate electrode GE is located under the active layer ACT.

The buffer layer BUL reduces or prevents impurities from being diffused and penetrated into the active layer ACT from the base substrate BS, so that it is possible to avoid deterioration of electrical properties of the thin film transistor. The buffer layer may include at least one of an organic insulating layer and an inorganic insulating layer. In addition, the buffer layer BUL may reduce or prevent moisture and oxygen penetrating into the display element OLED from the outside. The buffer layer BUL may also planarize a surface of the base substrate BS.

The protective layer PSV may cover the thin film transistor. The protective layer PSV may allow a portion of the drain electrode DE to be exposed therethrough. The protective layer PSV may include at least one layer. For example, the protective layer PSV may include at least one of an inorganic protective layer and an organic protective layer. For example, the protective layer PSV may include an inorganic protective layer that covers the thin film transistor, and an organic protective layer located on the inorganic protective layer.

The display layer DDL may be located on the protective layer PSV. In the pixel, the display layer DDL may include a display element OLED connected to the thin film transistor, and an encapsulation layer SLM that covers the display element OLED.

The display element OLED may include a first electrode AD connected to the drain electrode DE, an emitting layer EML located on the first electrode AD, and a second electrode CD located on the emitting layer EML.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the display element OLED is a bottom-emission organic light emitting device, the first electrode AD may be a transmissive electrode, and the second electrode CD may be a reflective electrode. When the display element OLED is a top-emission organic light emitting device, the first electrode AD may be a reflective electrode, and the second electrode CD may be a transmissive electrode. When the display element OLED is a dual-emission light emitting device, both of the first electrode AD and the second electrode CD may be transmissive electrodes. Hereinafter, a case where the first electrode AD is an anode electrode and where the display element OLED is a top-emission organic light emitting device is described as an example.

The first electrode AD may be on the protective layer PSV. The first electrode AD may include a reflective layer capable of reflecting light, and a transparent conductive layer located over or under the reflective layer. At least one of the transparent conductive layer and the reflective layer may be connected to the drain electrode DE.

The reflective layer may include a material capable of reflecting light. For example, the reflective layer may include at least one selected from the group consisting of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer PDL may be located on the first electrode and on the protective layer PSV. The pixel defining layer PDL may allow a portion of the first electrode AD to be exposed therethrough. For example, the pixel defining layer PDL may have a shape covering an edge of the first electrode AD and covering the protective layer PSV.

The emitting layer EML may have a multi-layered thin film structure at least including a light generation layer (LGL). For example, the emitting layer EML may include a hole injection layer (HIL) for injecting holes, a hole transport layer (HTL) having an excellent hole-transporting property, the HTL for increasing the opportunity for holes and electrons to be re-combined by suppressing the movement of electrons that fail to be combined in the LGL, the LGL for emitting light through the re-combination of the injected electrons and holes, a hole-blocking layer (HBL) for suppressing the movement of holes that fail to be combined in the LGL, an electron transport layer (ETL) for smoothly transporting electrons to the LGL, and an electron injection layer (EIL) for injecting electrons. In the emitting layer EML, the HIL, HTL, HBL, ETL, and EIL may be common layers commonly located in pixels adjacent to each other.

The color of light generated in the LGL may be, for example, one of red, green, blue, and white, but this embodiment is not limited thereto. For example, the color of light generated in the LGL may also be one of magenta, cyan, and yellow.

The second electrode CD may be located on the emitting layer EML. The second electrode CD may be a semi-transmissive reflective layer. For example, the second electrode CD may be a thin metal layer having a sufficient thickness through which light, which is emitted through the emitting layer EML, can be transmitted. The second electrode CD may transmit a portion of the light emitted from the emitting layer EML therethrough, and may reflect the rest of the light emitted from the emitting layer EML. The light reflected from the second electrode CD may be reflected from the reflective layer to be transmitted through the second electrode CD by constructive interference.

The second electrode CD may include a material having a lower work function than the transparent conductive layer of the first electrode AD. For example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

Meanwhile, a portion of the light emitted from the emitting layer EML may not be transmitted through the second electrode CD, and the light reflected from the second electrode CD may be again reflected from the reflective layer. That is, the light emitted from the emitting layer EML may resonate between the reflective layer and the second electrode CD. The light extraction efficiency of the organic light emitting device OLED can be improved by the resonance of the light.

The distance between the reflective layer and the second electrode CD may be changed depending on a color of the light emitted from the emitting layer EML. That is, the distance between the reflective layer and the second electrode CD may be adjusted to correspond to a resonance distance corresponding to a color of the light emitted from the emitting layer EML.

The encapsulation layer SLM can reduce or prevent oxygen and moisture infiltration into the display element OLED. The encapsulation layer SLM may include a plurality of inorganic layers and a plurality of organic layers. For example, the encapsulation layer SLM may include a plurality of unit encapsulation layers including the inorganic layer, and including the organic layer located on the inorganic layer. In addition, the inorganic layer may be located at the uppermost portion of the encapsulation layer SLM. The inorganic layer may include at least one selected from the group consisting of silicon oxide, silicon nitride, silicon oxynitride, aluminum oxide, titanium oxide, zirconium oxide, and tin oxide.

Meanwhile, in this embodiment, a case where the encapsulation layer SLM is applied to isolate the display element OLED from an external environment is described as an example, but the present disclosure is not limited thereto. In order to isolate the display element OLED from the external environment, an encapsulation substrate may be applied instead of the encapsulation layer SLM. The encapsulation substrate may be joined together with the base substrate BS through a sealant. When the display element OLED is isolated from the external environment by using the encapsulation substrate, the encapsulation layer SLM may be omitted.

The window substrate WD may be on at least one surface of the display panel DPN. For example, the window substrate WD may be on a surface of the display panel PDN in a direction in which light is emitted from the display panel DPN. The window substrate WD may have a shape corresponding to that of the display panel DPN. Also, the window substrate WD may have a plate shape having two major surfaces.

The window substrate WD may at least include a glass substrate GLS, a shock wave transmission layer SWT, and an adhesive layer ADL.

The glass substrate GLS may include silicate, and may be a reinforced glass that is chemically reinforced by an ion exchange process.

The shock wave transmission layer SWT may be on one surface of the glass substrate GLS. The shock wave transmission layer SWT may be optically transparent. The density and elastic modulus of the shock wave transmission layer SWT may be respectively less than those of the glass substrate GLS.

The adhesive layer ADL may be on the shock wave transmission layer SWT. The adhesive layer ADL may allow the window substrate WD to be attached to the display panel DPN. The density and elastic modulus of the adhesive layer ADL may be respectively less than those of the shock wave transmission layer SWT.

In an embodiment of the present disclosure, the window substrate WD may further include a coating layer CTL on the other surface of the glass substrate GLS, and a cover layer CVL on the coating layer CTL.

The coating layer CTL is on the other surface of the glass substrate GLS, and may reinforce the surface of the glass substrate GLS. The density and elastic modulus of the coating layer CTL may be respectively greater than those of the glass substrate GLS.

The cover layer may be an anti-reflection layer that reduces or minimizes reflection on the surface of the glass substrate GLS. Also, the cover layer CVL may be an anti-stain layer that reduces or prevents a stain such as a handprint (e.g., a fingerprint) of the user.

A shock wave generated by a shock applied to a surface of the window substrate WD may be transmitted to the glass substrate GLS through the coating layer CLT. Also, the shock wave may be transmitted from the glass substrate GLS through the shock wave transmission layer SWT and the adhesive layer ADL. The shock wave transmitted to the adhesive layer ADL may be emitted to the outside, or may be relieved inside, dissipated, or absorbed by, the adhesive layer ADL.

According to the present disclosure, it is possible to provide a window substrate capable of ensuring durability and safety of a user, and a display device having the window substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and in their functional equivalents.

What is claimed is:

1. A window substrate comprising:
    a glass substrate;
    a shock wave transmission layer on a first surface of the glass substrate, the shock wave transmission layer being a single layer; and
    an adhesive layer for coupling the window substrate to a display panel, and located on a surface of the shock wave transmission layer that is most distant from the glass substrate,
    wherein a density and an elastic modulus of the shock wave transmission layer are respectively less than those of the glass substrate,
    wherein the density of the shock wave transmission layer decreases in a direction away from the glass substrate and toward the adhesive layer due to a gradually increasing absence of material corresponding to pores defined in the shock wave transmission layer in the direction away from the glass substrate and toward the adhesive layer,
    wherein a density of the pores varies, such that a number of respective ones of the pores that are located at substantially a same respective distance from the glass substrate and along a same respective horizontal line increases in the direction away from the glass substrate, wherein a density and an elastic modulus of the adhesive layer are respectively less than those of the shock wave transmission layer, wherein the window substrate further comprises a coating layer on a second surface of the glass substrate, wherein a density and an elastic modulus of the coating layer are respectively greater than those of the glass substrate, and wherein the coating layer comprises silicon nitride ($Si_3N_4$).

2. The window substrate of claim 1, wherein the density of the shock wave transmission layer is equal to or greater than about 4% of the density of the glass substrate, and wherein the elastic modulus of the shock wave transmission layer is equal to or greater than about 2% of the elastic modulus of the glass substrate.

3. The window substrate of claim 1, wherein the shock wave transmission layer comprises an organic material having pores distributed therein.

4. The window substrate of claim 1, wherein a thickness of the coating layer is about 1 nm to about 1 μm.

5. The window substrate of claim 1, wherein a thickness of the shock wave transmission layer is about 1 μm about 100 μm.

6. A display device comprising:
a display panel;
a window substrate on one surface of the display panel, and comprising a glass substrate, and a shock wave transmission layer on a first surface of the glass substrate, the shock wave transmission layer being a single layer; and an adhesive layer on a surface of the shock wave transmission layer that is most distant from the glass substrate, wherein a density and an elastic modulus of the shock wave transmission layer are respectively less than those of the glass substrate, wherein the density of the shock wave transmission layer decreases in a direction away from the glass substrate and toward the display panel due to a gradually increasing absence of material corresponding to pores defined in the shock wave transmission layer in the direction away from the glass substrate and toward the display panel, wherein a density of the pores varies, such that a number of respective ones of the pores that are located at substantially a same respective distance from the glass substrate and along a same respective horizontal line increases in the direction away from the glass substrate, wherein a density and an elastic modulus of the adhesive layer are respectively less than those of the shock wave transmission layer, wherein the window substrate further comprises a coating layer on a second surface of the glass substrate, wherein a density and an elastic modulus of the coating layer are respectively greater than those of the glass substrate, and wherein the coating layer comprises silicon nitride ($Si_3N_4$).

7. The display device of claim 6, wherein the shock wave transmission layer comprises an organic material having pores distributed therein.

* * * * *